United States Patent [19]
Allen

[11] Patent Number: 5,379,442
[45] Date of Patent: Jan. 3, 1995

[54] FAST PRIMARY AND FEEDBACK PATH IN A PROGRAMMABLE LOGIC CIRCUIT

[75] Inventor: Michael J. Allen, Rescue, Calif.

[73] Assignee: Intel Corporation, Santa Clara, Calif.

[21] Appl. No.: 42,081

[22] Filed: Mar. 31, 1993

[51] Int. Cl.[6] .......................... G06F 9/32; G06F 9/46; G06F 13/18; G06F 13/38

[52] U.S. Cl. ...................... 395/800; 364/238.3; 364/229.5; 364/238.9; 364/238.1; 364/240.5; 364/242; 364/241.2; 364/243.6; 364/244.9; 364/DIG. 1; 364/DIG. 2

[58] Field of Search ............... 395/375, 250, 275, 800, 395/325, 550, 400, 425; 364/DIG. 1, DIG. 2, 716; 340/825.51, 825.52

[56] References Cited

U.S. PATENT DOCUMENTS

| | | | |
|---|---|---|---|
| 4,701,842 | 10/1987 | Olnowich | 395/375 |
| 4,837,676 | 6/1989 | Rosman | 395/375 |
| 4,876,640 | 10/1989 | Shanka et al. | 364/716 |
| 4,930,097 | 5/1990 | Ledenbach et al. | 364/716 |
| 5,121,473 | 6/1992 | Hodges | 395/375 |
| 5,142,630 | 8/1992 | Ishikawa | 395/375 |

Primary Examiner—Alyssa H. Bowler
Assistant Examiner—Daniel H Pan
Attorney, Agent, or Firm—Blakely, Sokoloff, Taylor & Zafman

[57] ABSTRACT

A plurality of programmable circuits joining input terminals to output terminals in a product term of a programmable logic circuit. Each circuit includes a first multiplexor joining an input terminal to a first node, a second multiplexor joining an output terminal to the first node, and a source of signals of a first value. Further included is a first apparatus for selecting whether to transfer signals either from the first and second multiplexors or from the source of signals of the first value to the first node, and a second apparatus for selecting whether to transfer signals either from the first multiplexor or the second multiplexor to the first node A third apparatus determines whether a third multiplexor selects either the signal at the first node for transfer to the output terminal or the inverse of the signal at the first node for transfer to the output terminal.

11 Claims, 3 Drawing Sheets

FAST PRIMARY AND FEEDBACK PATH IN A PROGRAMMABLE LOGIC CIRCUIT

BACKGROUND OF THE INVENTION

1. Field of the Invention

This invention relates to programmable logic circuits and, more particularly, to methods and apparatus for increasing the speed and reducing the power utilized by such circuits.

2. History of the Prior Art

Programmable logic arrays (PLAs) are arrays of gates which allow a plurality of input values to be manipulated in accordance with various Boolean functions. Essentially, such an array comprises a first series of input conductors each of which may carry a binary input value and a second series of conductors each of which may carry the inverse of the binary input value carried by an associated one of the first series of input conductors. These first and second input conductors are selectively joined to a third series of conductors each of which is connected to a plurality of AND gates, one input conductor to each one of the third series of conductors. In a PLA, the output of each AND gate (a product term) is available at the input to each of a plurality of OR gates. Since any one of the input conductors may be selectively joined to each of the third set of conductors, all of the input conductors are available to each of the AND gates in a PLA. By connecting various AND gate outputs to various OR gates, a particular Boolean function which is the sum of the product terms produced by the AND gates may be furnished at the output of any OR gate. The Boolean output function provided at the output of each of the OR gates is programmable by a user at the manufacturing stage by programming the connections to be made through the particular devices (EPROM cells, fuses, flash EEPROM cells) used in the PLA.

Because the various Boolean functions provided by a PLA are entirely programmable, the speed of operation is slowed to some extent. This occurs because all of the inputs must be available to all of the AND gates, and all of the AND gate outputs must be available to all of the OR gates. Improvements to overcome this loss of speed gave rise to the programmable array logic (PAL®) in which inputs to the OR gates which sum the product term outputs of the various AND gates are limited in number and hardwired (and are therefore not programmable). Reducing the programmability increases the speed of the array but reduces the options available and limits the number of inputs to each OR gate to a fixed number. Typically, each OR gate receives input of product terms from eight AND gates.

An improvement to PAL circuits provides hardwired OR gates but varies the number of AND gates connected to each OR gate so that a variety of functions having different numbers of product terms are available in the array. This type of product is called a programmable logic device (PLD). A PLD offers more options than do PALs but tends to under utilize devices since the average number of connections to any OR gate output is three product terms. Another enhancement is called product term allocation. Product term allocation allows some of the inputs to the OR gates to be switched between adjacent OR gates. This allows the numbers of inputs to any OR gate to be increased by a fixed number of input lines and increases the utilization of devices.

As computer designs improve and the number of input terminals to a programmable logic circuit increases, the size of the array increases dramatically. This occurs because there is a ratio between the number of inputs and outputs in an array which provides optimum performance. The result of an increase in the number of inputs to the array is that the array slows down.

Various attempts have been made to increase the speed of operation of these programmable logic circuits. One advance has removed the programmable devices from the speed path of the array. Such an arrangement is disclosed in U.S. Pat. No. 4,930,097 to Ledenbach et al. Although removing these devices has made the transfer through the primary speed path more rapid, a secondary feedback path in such circuitry has been complicated and lengthened. This has slowed the arrays to some extent. Another problem with the prior art solution has been that the circuitry uses too much power to find practical use in more modern computer systems in which low power usage is paramount.

SUMMARY OF THE INVENTION

It is, therefore, an object of the present invention to provide circuitry for increasing the speed of operation of programmable logic circuits.

It is another, more specific, object of the present invention to provide apparatus for increasing the speed of operation of programmable logic circuits including those portions of such circuits necessary to produce input signals through feedback arrangements.

It is an additional object of the present invention to reduce the power consumed by programmable logic arrays.

These and other objects of the present invention are realized in a plurality of programmable circuits joining the input terminals to the output terminals in a product term of a programmable logic circuit each circuit including a first multiplexor joining an input terminal to a first node, a second multiplexor joining an output terminal to the first node, a source of signals of the first value, a first apparatus for selecting whether to transfer signals either from the first and second multiplexors or from the source of signals of the first value to the first node, a second apparatus for selecting whether to transfer signals either from the first multiplexor or the second multiplexor to the first node, a third multiplexor joining the first node to the output terminal, and a third apparatus for causing the third multiplexor to select either the signal at the first node for transfer to the output terminal or the inverse of the signal at the first node for transfer to the output terminal.

These and other objects and features of the invention will be better understood by reference to the detailed description which follows taken together with the drawings in which like elements are referred to by like designations throughout the several views.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

DETAILED DESCRIPTION

Figure 1:
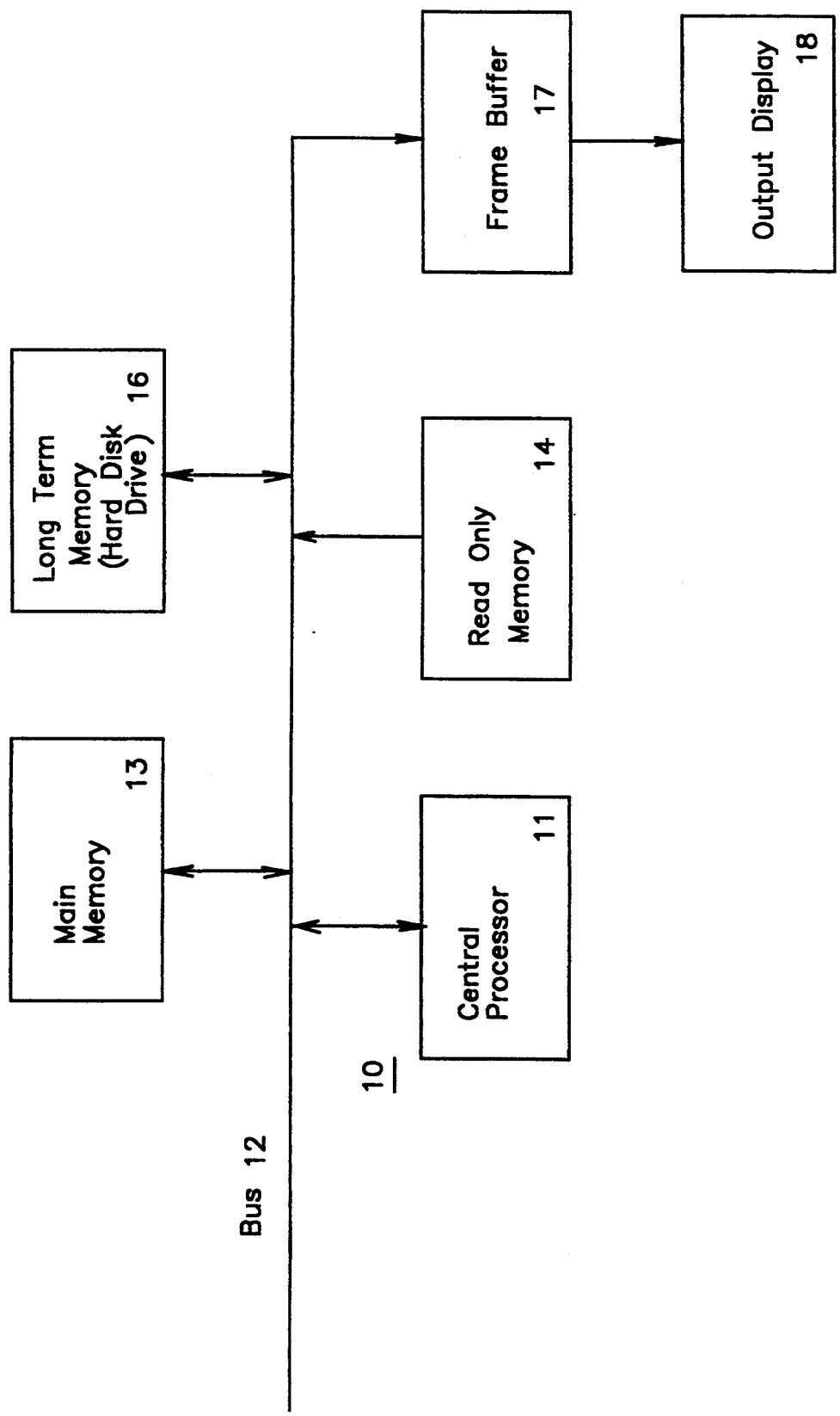
FIG. 1 is a block diagram illustrating a computer system including apparatus designed in accordance with the present invention.

Referring now to FIG. 1, there is illustrated a computer system 10. The system 10 includes a central processor 11 which carries out the various instructions provided to the computer 10 for its operations. The central processor 11 is ,joined to a bus 12 adapted to carry information to various components of the system 10. Joined to the bus 12 is main memory 13 which is typically constructed of dynamic random access memory arranged in a manner well known to those skilled in the prior art to store data being manipulated by the central processor 11 during the period in which power is provided to the system 10. Also joined to the bus 12 is read only memory 14 which may include various memory devices such as electrically programmable read only memory (EPROM) devices well known to those skilled in the art which are adapted to retain a memory condition in the absence of power to the system 10. The read only memory 14 typically stores various basic functions used by the processor 11 such as basic input/output and startup processes.

Also connected to the bus 12 are various peripheral components. One of those peripheral components may include memory circuits such as long term memory 16. The construction and operation of long term memory 16 (typically electro-mechanical hard disk drives) is well known to those skilled in the art. Also joined to the bus 12 is circuitry such as a frame buffer 17 to which data may be written which is to be transferred to an output device such as a monitor 18 for display.

Figure 2:
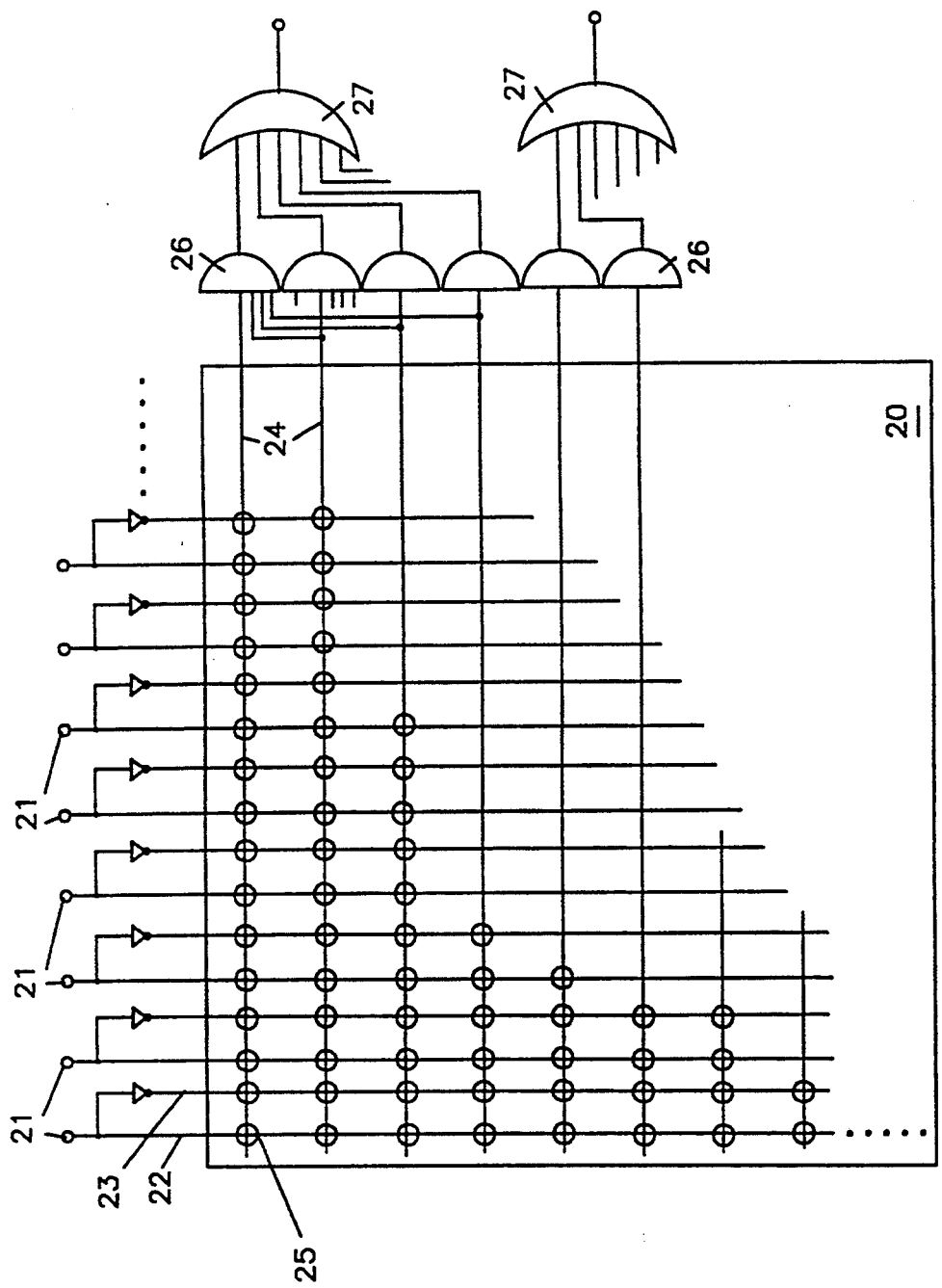
FIG. 2 is another block diagram illustrating in general the design of a programmable logic circuit used in FIG. 1.

FIG. 2 is a block diagram illustrating a programmable logic circuit 20. The logic circuit 20 may include circuitry constructed in accordance with the prior art; and the circuit 20 may also include circuitry designed in accordance with the present invention to both increase the speed of operation and to reduce the power usage typical to such circuits. Such a circuit may be used for example to provide the decoding function in the instruction decoding portion of a central processing unit 11 shown in FIG. 1. Such a decoding function reduces each instruction furnished to a set of output signals which produce a certain operation to be executed by the central processing unit of a computer. A programmable logic circuit may also be utilized to accomplish various address decoding in a manner well known to those skilled in the art. In a similar manner, a circuit designed in accordance with the present invention may be utilized to provide any other logic function for which the particular array provides a sufficient number of input and output terminals to handle the particular operation.

The particular circuit illustrated in FIG. 2 shows an array 20 which may receive a plurality of input signals provided as inputs at input terminals 21 associated with the array. From each input terminal 21, a first conductor 22 transverses the array (vertically in FIG. 2) to carry the signal presented; while a second conductor 23 traverses the array 20 to carry the inverse of the signal presented. Each of these conductors 22 and 23 may be connected through a programmable device 25 to any of a series of conductors 24. All of the conductors 24 are connected as inputs to a plurality of AND gates 26. In this manner, any input value or its inverse may be ANDed with any other input value or its inverse. Such an AND gate with its input circuitry is typically referred to as a product term. The output signals produced by a number of these AND gates 26 (typically eight in a PAL) are furnished to a plurality of OR gates 2 7 each of which produces an output value. Since any Boolean logic term may be reduced to an AND and an OR function, such an array is able to produce any desired Boolean operation if its programmable devices are appropriately programmed.

Figure 3:
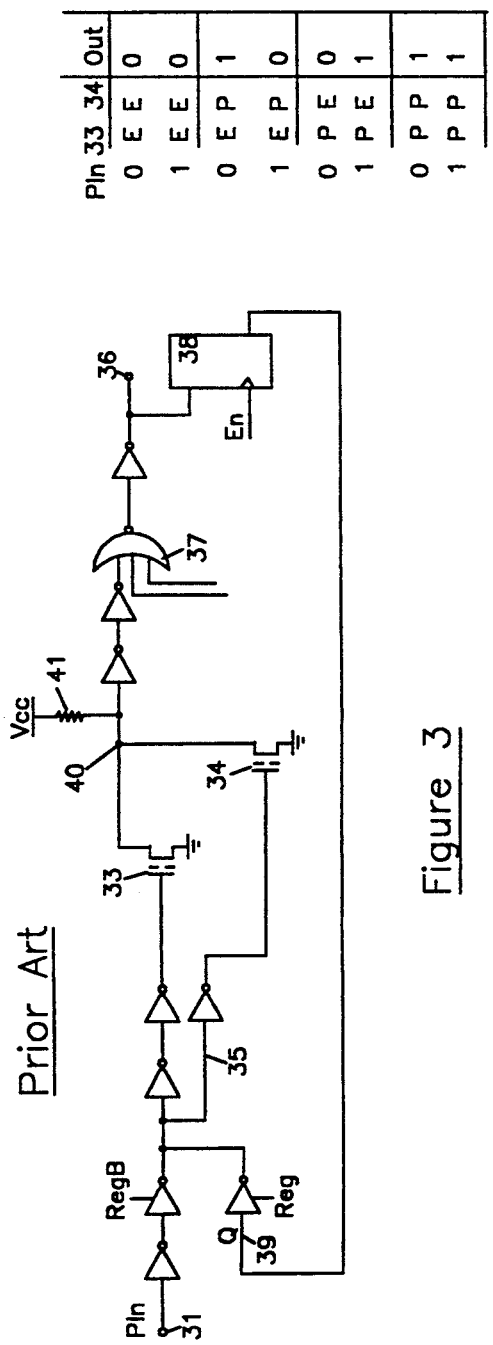
FIG. 3 is a circuit diagram illustrating an arrangement of an individual product term designed in accordance with the prior art.

FIG. 3 is a circuit diagram illustrating a particular input circuit 30 for a product term designed in accordance with the prior art. The input circuit 30 receives input signals at an input terminal 31. These signals are transferred via a first conductor 32 to the gate of a first programmable device 33. The signals are also inverted and transferred simultaneously via a conductor 35 to the gate terminal of another programmable device 34. In a particular embodiment, the devices 33 and 34 may be electrically programmable read only memory devices (EPROM devices, flash EEPROM devices, fuses, or other devices) which may be placed in one of two distinct conditions which may be determined by interrogating the state of the device. For example, if the devices 33 and 34 are flash EEPROM devices (floating gate field effect transistor devices), when they have been programmed (by circuitry which is well known to those skilled in the art but is not pertinent to the present invention and is therefore not shown) and a voltage less than the drain voltage Vcc but higher than ground (a one value) is placed at the gate terminal, no drain current flows. This produces an output voltage value of Vcc (a one value) at the drain terminal and at a node 40. Alternatively, when such devices are erased, they conduct drain current and produce an output voltage value of approximately ground (a zero value) when a one value is furnished at the gate terminal. By programming selected ones of the two devices 33 and 34, a selected output pattern may be produced.

A path exists from the output of the devices 33 and 34 through a NOR gate 37 (which typically receives a number of other input signals from other product terms to accomplish a particular Boolean function) to an output terminal 36. The results of the output produced may be latched by a latch 38 and furnished as feedback at another Q input terminal 39 to the circuit. A pair of inverting buffers which are enabled by selectable control signals Reg and its inverse RegB determine which of the two input terminals PIn or Q is chosen.

The truth table to the right of the circuit diagram in FIG. 3 illustrates the various conditions which may be produced at the output node 40 by the devices 33 and 34. These signals are provided to the NOR gate 37 to affect the result produced at the output terminal 36 in response to various input signals at the terminals 31 and 39 and the various programmed and erased conditions of the devices 33 and 34. For example, if a one value (a high value) is placed at the PIn terminal 31 with both devices 33 and 34 erased and the path from the terminal 31 is selected, a one is placed at the gate terminal of the device 33 and a zero at the gate terminal of the device 34. In the erased condition, the device 33 conducts when a one is placed at its gate terminal while the device 34 does not conduct. This causes a low value or zero (approximately ground) to appear at a node 40. The low value is inverted and appears at the input to the NOR gate 37 as a one value. Similarly, when both devices are erased, a low value at the terminal 31 causes the device 34 to conduct while the device 33 remains off again producing a zero value at the node 40 and a one value at the input to the NOR gate 37. Thus, in the erased condition of the devices 33 and 34, either a low or a high value at the input terminal 31 produces a low output signal at the node 40.

If the devices 33 and 34 are both programmed, then no current flows through either device 33 or 34 in the presence of a one at the gate terminal. Consequently, the voltage Vcc which is provided at the node 40 through a resistor 41 is produced at the node 40 is response to either a one or a zero value at the input terminal 31.

On the other hand, when the device 33 is programmed and the device 34 is erased, a one value at the terminal 31 produces a one value at the gate terminal of the device 33 and a zero value at the gate terminal of the device 34. Since the device 33 is programmed, a one does not cause the device 33 to conduct. Since the device 34 receives a low value at its gate terminal, it does not conduct. Consequently, the node 40 is held at the value of Vcc (high). When a zero value is placed at the terminal 31, this produces a one at the gate terminal of the device 34 causing that device to conduct and placing a zero value at the node 40.

In a similar manner, when the device 34 is programmed and the device 33 is erased, a one value at the terminal 31 produces a one value at the gate terminal of the device 33 and a zero value at the gate terminal of the device 34. Since the device 33 is not programmed, a one causes the device 33 to conduct and provide a low value at the output node 40. Since the device 34 receives a low value at its gate terminal, it does not conduct. When a zero value is placed at the terminal 31, this produces a one at the gate terminal of the device 34 which, however, is programmed and unable to conduct so that a high value from the source Vcc appears at the node 40. Thus, as may be seen, the devices 33 and 34 may be programmed to provide a number of different output signals. Although only input signals at the terminal 31 have been discussed, it will be recognized that input signals from the feedback path through the Q terminal 39 might be similarly selected and produce similar results.

It will be noticed that in the prior art circuit illustrated in FIG. 3, the devices 33 and 34 each lie in the path from the terminals 31 and 39 to the output node 40. Consequently, each of these devices must be operated before output signals appear at the node 40. This causes delay in the circuitry of FIG. 3. In order to overcome this problem, the arrangements described in detail in U.S. Pat. No. 4,930,097 were devised. In each of these arrangements, the programmable devices are removed from the speed path (the path between the input terminal at which signals are received and the output node) so that operation are accelerated. In one arrangement illustrated in that patent, the conditions of the programmable devices are utilized to enable buffer stages to allow the transfer of a signal from the input terminal only if the device is erased. The conditions of the programmable devices are also connected to provide voltage from the source Vcc at the output node if both devices are erased. If both devices are programmed, the value at the input terminal has no effect on the output which remains low. Thus, this improved circuit produces the same desired logical output result which is produced by the circuit of FIG. 3.

A second circuit disclosed in the above-mentioned patent utilizes the condition of a single programmable device to control the condition of a multiplexor. The multiplexor in turn controls whether a signal or the inverted value of the signal is transferred to the output node. This circuit does not, however, provide the conditions in which an input has no effect on the output (which remains low or high depending on the condition of the programmable devices alone).

Although these circuits increase the speed through the path directly from the input terminal to the output node in product terms by removing the programmable devices from the speed path, the circuits illustrated in the patent have been found to exhibit some problems in use. For one thing, the input path furnished through the feedback path at the Q input terminal in those circuits is slower than the direct path because it includes a number of additional stages which delay the operation of the circuitry. Additionally, the condition of the circuitry in some conditions provides contention at the output node where two devices are attempting to both control the voltage value. This contention is capable of disrupting circuit operation.

Figure 4:
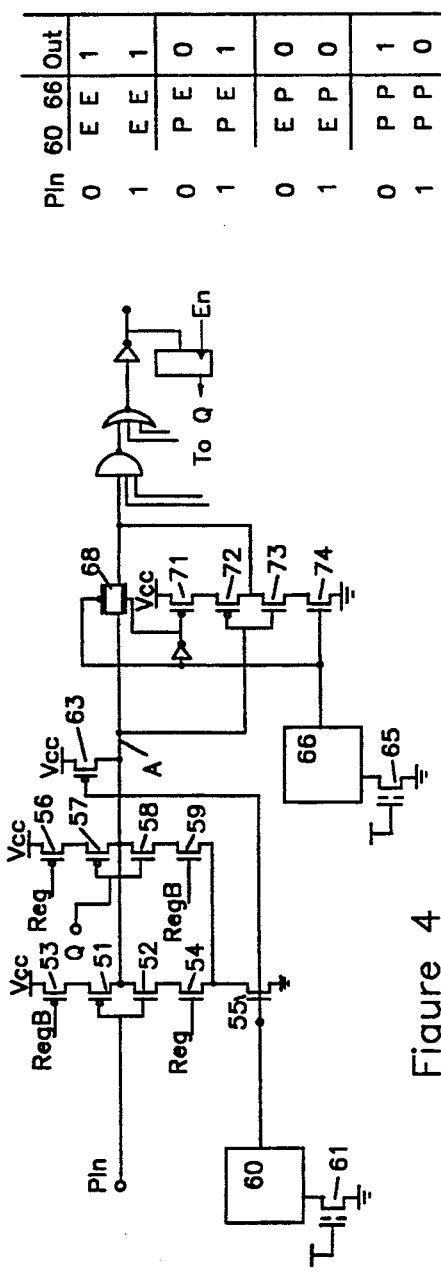
FIG. 4 is a circuit diagram illustrating an arrangement of an individual product term which may be used in accordance with the present invention.

Referring now to FIG. 4, there is illustrated a circuit diagram of a single input to a product term constructed in accordance with the present invention. The product term receives an input signal at a terminal PIn. The value of the signal is applied to the gate terminals of a P channel field effect transistor device 51 and an N channel field effect transistor device 52. The devices 51 and 52 have their drain and source terminals connected in a series path with the source and drain terminals of another P channel device 53 and another N channel device 54 between a source of potential Vcc and another N channel device 55 which has its source terminal joined to ground. The devices 51, 52, 53, and 54 form a first multiplexing input for input signals applied at the PIn input terminal. A second set of N and P channel devices 56, 57, 58, and 59 are similarly arranged between the source Vcc and the device 55 to form a second multiplexing input for input signals applied at the Q input terminal. As may be seen, an input signal which is applied at the PIn input terminal will attempt to turn on either the device 51 or 52 while an input signal which is applied at the Q input terminal will attempt to turn on either the device 57 or 58.

Control signals Reg and RegB (the inverse of Reg) are applied to the gates of the devices 53, 54, 56, and 59 to resolve whether the input signal at the terminal PIn or the terminal Q is selected. Typically these signals are provided by a programmable device so that the value once programmed remains constant and helps determine the circuit operation. The control signal Reg is applied to the gates of the devices 54 and 56 while the inverse signal RegB is applied to the gates of the devices 53 and 59. These signals determine whether the path selected for the input signals is from the input terminal PIn or from a feedback path represented at the terminal Q.

Thus, if the device 53 is enabled by a zero valued RegB signal while the device 54 receives a one valued Reg signal, then the signal at the PIn terminal controls what value is applied at the output. If the signal at the PIn terminal is low (a zero value), the device 51 is enabled; and the voltage Vcc is applied at the common output node. Alternatively, if PIn is high, then the device 52 is enabled; and the signal at the output is a zero value if the device 55 is conducting. Similarly, if the device 56 is enabled by a zero valued RegB signal while the device 59 receives a one valued Reg signal, then the signal at the Q terminal controls what value is applied at the output. If the input value at the Q terminal is low (a zero value), the device 57 is enabled; and Vcc is applied at the common output node. Alternatively, if Q is high, then the device 58 is enabled; and the signal at the output is a zero value if the device 55 is conducting.

The state of the device 55 is controlled in the embodiment illustrated by the condition of a static random access memory cell 60. The cell 60 is constructed in a manner well known to those skilled in the art to assume a zero or a one condition when enabling voltages are provided. The state of the cell 60 is determined by the condition of a programmable ROM device 61 such as a flash EEPROM memory cell which retains its condition when power is removed from the circuit. Thus, if the cell 61 is programmed, no current flows; and the flash EEPROM cell 61 produces a one valued output condition. This forces the cell 60 to a one valued output condition and enables the device 55 so that the input value placed at the PIn terminal or the feedback signal placed at the terminal Q control the output value in the manner described above. The one value at the output of the cell 60 also disables a P channel device 63.

When, on the other hand, the flash cell 61 is erased and ground is provided at the output of the cell 60, the N channel device 55 is disabled; and the P channel device 63 is enabled. This causes the voltage Vcc to be connected to the node A. With the value Vcc applied at the node A through the device 63, the values applied at the terminals PIn and Q have no affect on the output. Thus in the state in which the cell 61 is erased, the output produced at the node A is always high (Vcc). This is identical to the situation with the circuit of FIG. 3 is which both of the flash devices 33 and 34 are programmed.

The output value furnished to the NOR gate of the product term is further controlled by another ROM cell 65 and an associated static random access memory cell 66. If the cell 65 is erased so that it conducts, then a zero value is produced at its output and at the output of the cell 66. This zero value enables a transmission gate 68 so that the signal at the node A is transferred directly to an AND gate of the product term. At the same time, the zero output value from the cell 66 disables an N channel device 74 and a P channel device 71. This disables a bypass path to the AND gate. If, on the other hand, the cell 65 is programmed, a one is produced at its output and at the output of the cell 66. This one value disables the transmission gate 68. The one value enables each of the devices 71 and 74. The source and drain terminals of devices 71 and 74 are arranged in series with the source and drain terminals of devices 72 and 73 between Vcc and ground so that the value applied as input at the gate terminals of the devices 72 and 73 controls the value which appears at the AND gate. In fact, the value at the node A is inverted and applied at the AND gate in this condition. Thus, the transmission gate 68 and the devices 71, 72, 73, and 74 together function as a third multiplexor for selecting the signal to be transferred to the AND gate depending on the state programmed for the device 63 and the associated device 66.

Thus, by referring to the truth table to the right of FIG. 4, it will be seen that the circuit of FIG. 4 produces a series of output signals which are identical to those produced by the prior art circuit of FIG. 3. Consequently, the circuit of FIG. 4 may replace the circuit of FIG. 3 to provide the same logical results. However, in contrast to the circuit of FIG. 3, the circuit of FIG. 4 removes the programmable devices from the speed path of the circuitry including the product term. Moreover, in contrast to the circuits of the above-mentioned patent, the circuit of FIG. 4 allows the logical operations to occur without contention at the output node. In addition, the circuit of FIG. 4 reduces the delay through the feedback path including the terminal Q so that the circuit functions more rapidly. The circuit of FIG. 4 also allows the power used by the array including the product terms to be significantly reduced. While each of the memory cells is on and drawing power in the operating state of the array of the prior art patents, in the circuit of FIG. 4 a distributed input arrangement is used where only the devices utilized by the particular product terms furnishing output signals are drawing current. This circuit draws no DC current and uses very little AC current. Because of this reduction in the power requirements, approximately ten times as many product gates can be included in the circuit as in that of the prior art patent.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A programmable logic circuit comprising
a plurality of input terminals for receiving input signals of first and second values,
a plurality of output terminals for transmitting output signals of first and second values, and
a plurality of programmable circuits joining the input terminals to the output terminals for controlling a value of an output signal produced in response to an input signal, each of the programmable circuits comprising
 a first multiplexor joining an input terminal to a first node,
 a second multiplexor joining an output terminal to the first node,
 a source of signals of the first value,
 first means coupled to the first and second multiplexors and the source of signals of the first value for selecting to transfer signals either from the first and second multiplexors or from the source of signals of the first value to the first node,
 second means for selecting to transfer signals either from the first multiplexor or the second multiplexor to the first node,
 a third multiplexor joining the first node to the output terminal, and
 third means for causing the third multiplexor to select either the signal at the first node for transfer to the output terminal or a inverse of the signal at the first node for transfer to the output terminal.

2. A programmable logic circuit as claimed in claim 1 in which the first means for selecting to transfer signals either from the first and second multiplexors or from the source of signals of the first value to the first node comprises
 means for enabling the first and second multiplexors,
 switching means for connecting the source of signals of a first value to the first node, and
 means for determining whether to operate the means for enabling the first and second multiplexors or the switching means for connecting the source of signals of a first value to the first node.

3. A programmable logic circuit as claimed in claim 2 in which the means for determining whether to operate the means for enabling the first and second multiplexors or the switching means for connecting the source of signals of a first value to the first node comprises programmable storage means capable of assuming a first or a second condition which condition determines whether to operate the means for enabling the first and second multiplexors or the switching means for connecting the source of signals of a first value to the first node.

4. A programmable logic circuit as claimed in claim 3 in which the programmable storage means capable of assuming a first or a second condition comprises
 a static random access memory cell, and
 an electrically programmable memory cell for determining a condition of the static random access memory cell.

5. A programmable logic circuit as claimed in claim 1 in which the third multiplexor joining the first node to the output terminal comprises
 a transmission gate, and
 means for inverting the signal at the first node,
and the third means for causing the third multiplexor to select either the signal at the first node for transfer to the output terminal or the inverse of the signal at the first node for transfer to the output terminal comprises
 means for enabling either the transmission gate or the means for inverting the signal at the first node.

6. A programmable logic circuit as claimed in claim 5 in which the means for enabling either the transmission gate or the means for inverting the signal at the first node comprises programmable storage means capable of assuming a first or a second condition which condition determines whether to enable either the transmission gate or the means for inverting the signal at the first node.

7. A programmable logic circuit as claimed in claim 6 in which the programmable storage means capable of assuming a first or a second condition comprises
 a static random access memory cell, and
 an electrically programmable memory cell for determining the condition of the static random access memory cell.

8. A programmable logic circuit comprising
a plurality of input terminals for receiving input signals of first and second values,
a plurality of output terminals for transmitting output signals of first and second values, and
a plurality of programmable circuits joining the input terminals to the output terminals for controlling a value of an output signal produced in response to an input signal, each of the programmable circuits comprising
 a first multiplexor joining an input terminal to a first node,
 a second multiplexor joining an output terminal to the first node,
 the first and second multiplexors being responsive to signals whereby either the first or the second multiplexor transfer signals,
 a source of signals of the first value,
 a first switching circuit coupled to the first and second multiplexors and the source of signals of the first value for selecting to transfer signals either from the first and second multiplexors or from the source of signals of the first value to the first node, and
 a third multiplexor joining the first node to the output terminal, the third multiplexor being responsive to input signals to select either the signal at the first node for transfer to the output terminal or a inverse of the signal at the first node for transfer to the output terminal.

9. A programmable logic circuit as claimed in claim 8 in which the first switching circuit for selecting to transfer signals either from the first and second multiplexors or from the source of signals of the first value to the first node comprises
 a first switch for enabling the first and second multiplexors,
 a second switch for connecting the source of the signals of a first value to the first node,
 a static random access memory cell providing an output value to operate the first and second switches, and
 an electrically programmable memory cell for determining a condition of the static random access memory cell.

10. A programmable logic circuit as claimed in claim 9 in which the third multiplexor joining the first node to the output terminal comprises
 a transmission gate, and an inverter joining the first node to the output terminal, and in which the logic circuit further comprises a source of signals for enabling either the transmission gate or the inverter.

11. A programmable logic circuit as claimed in claim 8 in which the source of signals for enabling either the transmission gate or the inverter comprises a static random access memory cell providing an output value to operate the transmission gate and the inverter, and an electrically programmable memory cell for determining the condition of the static random access memory cell.

* * * * *